(12) United States Patent
Fu et al.

(10) Patent No.: US 7,391,594 B2
(45) Date of Patent: Jun. 24, 2008

(54) APPARATUS FOR PROVIDING AN ADDITIONAL GROUND PAD AND ELECTRICAL CONNECTION FOR GROUNDING A MAGNETIC RECORDING HEAD

(75) Inventors: Yen Fu, San Jose, CA (US); Ellis Cha, San Ramon, CA (US); Po-Kang Wang, San Jose, CA (US); Hong Tian, Tai Po (HK); Manuel Hernandez, San Jose, CA (US); Yaw-Shing Tang, Saratoga, CA (US); Ben Hu, San Jose, CA (US)

(73) Assignee: SAE Magnetics (H.K.) Ltd., Shatin, N.T. (HK)

( * ) Notice: Subject to any disclaimer, the term of this patent is extended or adjusted under 35 U.S.C. 154(b) by 46 days.

(21) Appl. No.: 11/447,174

(22) Filed: Jun. 6, 2006

(65) Prior Publication Data
US 2006/0227461 A1    Oct. 12, 2006

Related U.S. Application Data

(62) Division of application No. 10/414,233, filed on Apr. 16, 2003, now Pat. No. 7,064,928.

(60) Provisional application No. 60/417,665, filed on Oct. 11, 2002.

(51) Int. Cl.
*G11B 5/60*    (2006.01)

(52) U.S. Cl. .................................................. 360/234.5
(58) Field of Classification Search ............. 360/245.8, 360/245.9, 234.5
See application file for complete search history.

(56) References Cited

U.S. PATENT DOCUMENTS

| 5,768,062 | A | 6/1998 | Anderson et al. |
| 5,896,248 | A | 4/1999 | Hanrahan et al. |
| 6,621,661 | B1 * | 9/2003 | Ichikawa et al. ......... 360/234.5 |
| 6,671,128 | B2 | 12/2003 | Crawford |
| 2003/0128474 | A1 | 7/2003 | Schulz et al. |

* cited by examiner

*Primary Examiner*—A. J. Heinz
(74) *Attorney, Agent, or Firm*—Kenyon & Kenyon LLP

(57) ABSTRACT

Apparatus are presented for electrically coupling a slider to ground. In one embodiment, a bonding pad is provided on a side of the slider body separate from the bonding pad(s) used for read/write signals. This separate bonding pad is electrically coupled within the slider body to components that are to be coupled to ground. A separate conductor provided on the suspension (e.g., a trace, a flex circuit, etc.) may be electrically coupled to the separate bonding pad via gold ball bonding. The conductor is also coupled to ground in the hard-disk drive device (e.g., via the preamplifier). The use of the separated bonding pad and trace may negate the need to use a conductive adhesive to electrically ground the slider via its attachment to the tongue of a slider.

4 Claims, 9 Drawing Sheets

APPARATUS FOR PROVIDING AN ADDITIONAL GROUND PAD AND ELECTRICAL CONNECTION FOR GROUNDING A MAGNETIC RECORDING HEAD

This is a division of application Ser. No. 10/414,233 filed Apr. 16, 2003 (now U.S. Pat. No. 7,064,928), which claims priority to U.S. provisional application No. 60/417,665 filed Oct. 11, 2002, the contents of which are incorporated herein by reference.

BACKGROUND INFORMATION

The present invention relates to magnetic hard disk drives. More specifically, the present invention relates to a method and apparatus for grounding a magnetic recording head that may avoid the use of a conductive adhesive.

A disk drive for data recording uses magnetic recording heads for writing and reading data on recording disks. The recording heads are built on a substrate, called a wafer, which is made of electrically conductive material, such as AlTiC, with processes similar to those for semiconductor devices. Gold pads on the external surface of the recording head are electrically connected to the recording devices through internal electrical paths built during the wafer-level processes. The wafer is then sliced into rectangular pieces with an individual recording head on each piece with the substrate attached, which is called a slider. Afterwards, the slider is mounted on a suspension. The assembly is called a head gimbal assembly, or HGA. The slider is then bonded on the suspension with glues, including a conductive glue to form an electrical connection between the substrate and a stainless steel component of the suspension. Additional electrical connections are made between the gold pads on the recording head and metal trace lines on the suspension with methods including ultrasonic bonding or soldering. Finally, the HGA is assembled into a hard disk drive device with the suspension traces connected to other electrical components, typically a pre-amplifier, and the stainless steel part of the suspension connected to the electrical ground of the drive.

Generally, there are two types of HGAs—wired and wireless. A wired HGA is one where separate lead wires are connected between the flex circuit of the HSA and the read write head. A wireless HGA is one where conductive traces are integrated with the flexure and provide conductivity between the flex circuit of the HSA and the read write head of the slider. In the art, there are typically two types of wireless suspensions. In the first type, such as trace suspension assemblies (TSAs) and circuit integrated suspension (CISs), traces are built though a subtractive process (e.g., an etching operation) or through an additive process (e.g., a plating or deposition process) on the stainless steel flexure, with an insulative layer between the trace and the flexure. After the traces are set in place, the flexure can then be welded to other parts of the suspension. In the second type, such as flex suspension assemblies (FSAs) and flex on suspension (FOS), the traces are built on an insulation layer and then covered with another insulation layer to form a flex circuit. This circuit is then attached to the suspension with adhesive. Alternatively, an additional metal layer called a ground plane can be attached to the flex circuit before it is adhered to the suspension. In an FSA, the flexure is integrated with a load beam and a mount plate along with the integrated traces for connectivity.

As illustrated in FIG. 1, a head gimbal assembly 40 often provides the slider with multiple degrees of freedom such as vertical spacing, or pitch angle and roll angle, which describe the flying height of the slider. As shown in FIG. 1, a suspension 74 holds the HGA 40 over the moving disk 76 (having edge 70) and moving in the direction indicated by arrow 80. In operation of the disk drive shown in FIG. 1, an actuator 72 moves the HGA over various diameters of the disk 76 (e.g., inner diameter (ID), middle diameter (MD) and outer diameter (OD)) over arc 78.

A preamplifier is typically connected to the head to supply write currents to the write head and receive currents from the read head. The preamplifier resides in a subassembly common referred to as the Actuator Flex Preamp Assembly (AFPA). The preamplifier is usually soldered to a flexible circuit. This flexible circuit provides the areas to which the HGA traces will be connected to complete the circuit connecting the preamplifier to the read and write elements of the head.

The suspension provides two functions: mechanical support and electrical connection between the head and the preamplifier. Rather than using physical wires to connect the head to the preamplifier, metal traces on the suspension are quite often used.

The method of using conductive glue to electrically ground the recording head substrate has many disadvantages. Most of all, the electrical resistance of the conductive glue is unreliable and hard to control. The resistance can be very high and widely variable from part to part during the manufacturing process. In addition, it is difficult to control the flatness of the slider after mounted into the HGA, which is another critical parameter. In addition, to apply and cure the conductive glue in the HGA assembly requires many processes adding to the cost and duration of the manufacturing process.

The use of the stainless steel suspension as the electrical grounding connection between the HGA and the electrical ground provided in the disk drive also may provide disadvantages. The electrical resistance of the stainless steel suspension may vary significantly between such components. If the electrical resistance of the stainless steel suspension is high, then there will be less reliable interfaces with other metal structures in the grounding path (e.g., the actuator).

In view of the above, there is a need for an improved method and apparatus for grounding a read/write head/slider that overcomes the disadvantages of these known systems.

DETAILED DESCRIPTION

Figure 1:
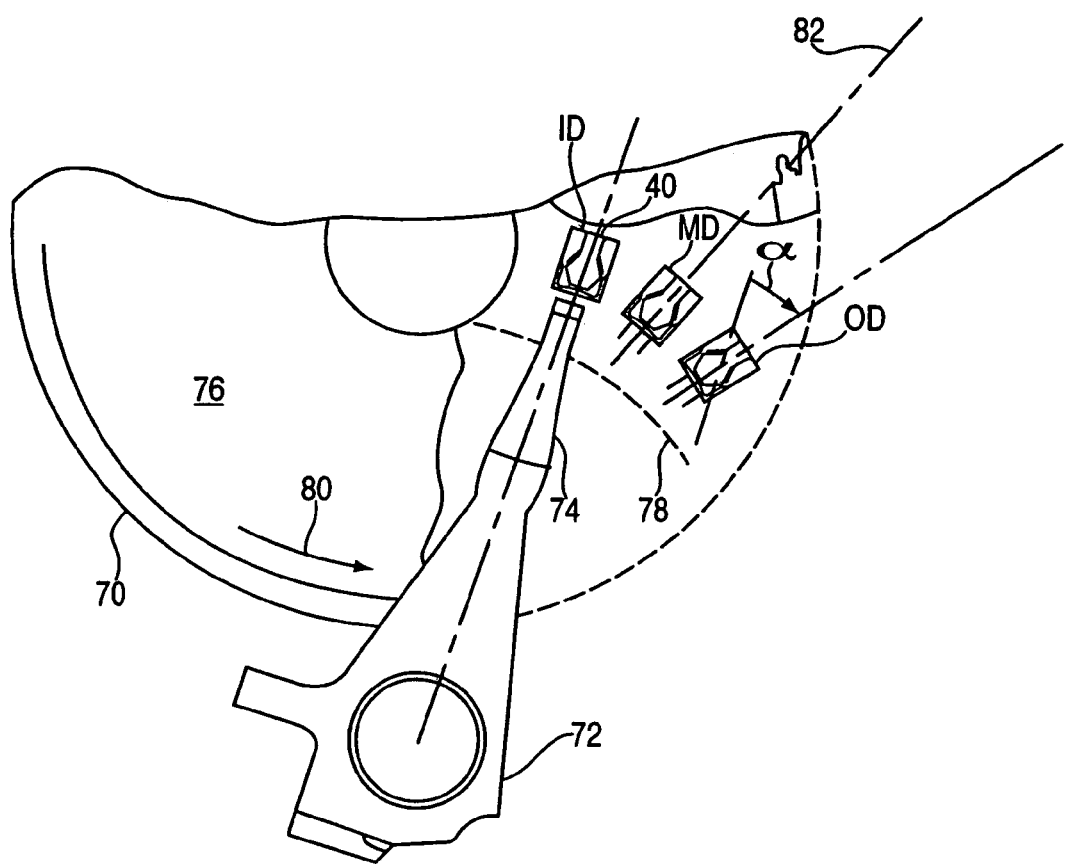
FIG. 1 provides an illustration of a drive arm in a hard disk drive device configured to read from and write to a magnetic hard disk as known in the art.
Figure 2:
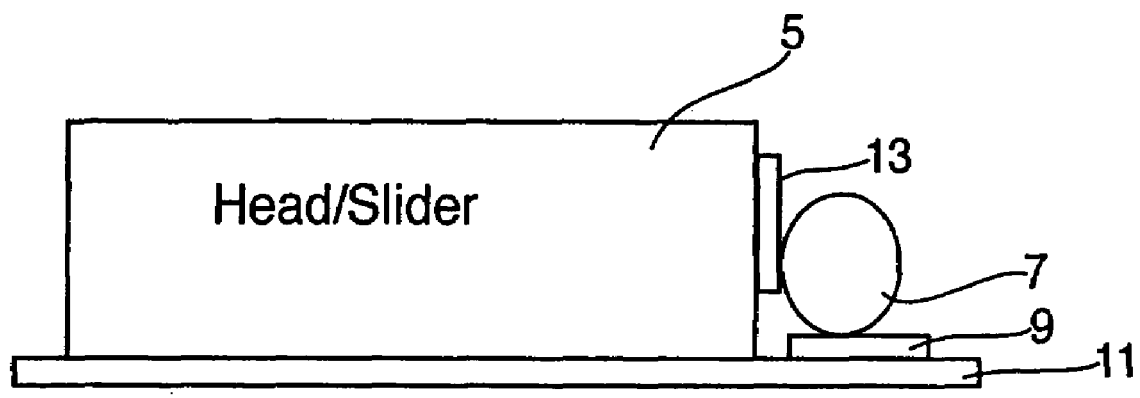
FIG. 2 provides an illustration of a gold ball bonding structure as used in embodiments of the present invention.

Referring to FIG. 2, a typical ball bonding structure is shown. As discussed above, the slider 5 includes electrical components and connections to facilitate the reading of data from and the writing of data to a storage medium, such as a rotating hard disk. To facilitate connection of the electrical components of the read and write "heads" to other components in the disk drive, an external bonding pad 13 is provided on the exterior of the slider. Likewise, the suspension also includes electrical components to be coupled to the read and write components of the slider. Typically, these electrical components include metal traces incorporated into the suspension 11, or a separate flex circuit that is attached to the suspension. In either case, a bonding pad 9 is typically provided on a surface of the suspension 11. A conductive material, such as a gold ball, solder ball, etc. is deposited between the bonding pad 13 of the slider 5 and the bonding pad 9 of the suspension 11. In this example, a gold ball 7 is used in a conventional manner. Likewise, the bonding pads 9 and 13 may be made of gold as well.

According to an embodiment of the present invention, a more reliable and well-controlled grounding of the substrate of the recording head 5 may be achieved through an electrical connection between an additional grounding trace line on the suspension 11 and an additional grounding gold pad on the recording head/slider, which is electrically connected to the substrate through internal conductive paths built into the recording head/slider at the wafer process level. The same method used to connect the other gold bonding pads and suspension trace lines can be used to connect the grounding gold bonding pad and the suspension grounding trace line, which can be more reliable and well-controlled than the use of a conductive glue. The suspension grounding trace line can then be electrically connected to the electrical ground of the hard disk drive, again using the same or similar method used to connect the other trace lines to other electrical components in the disk drive, typically the pre-amplifier.

Figure 3:
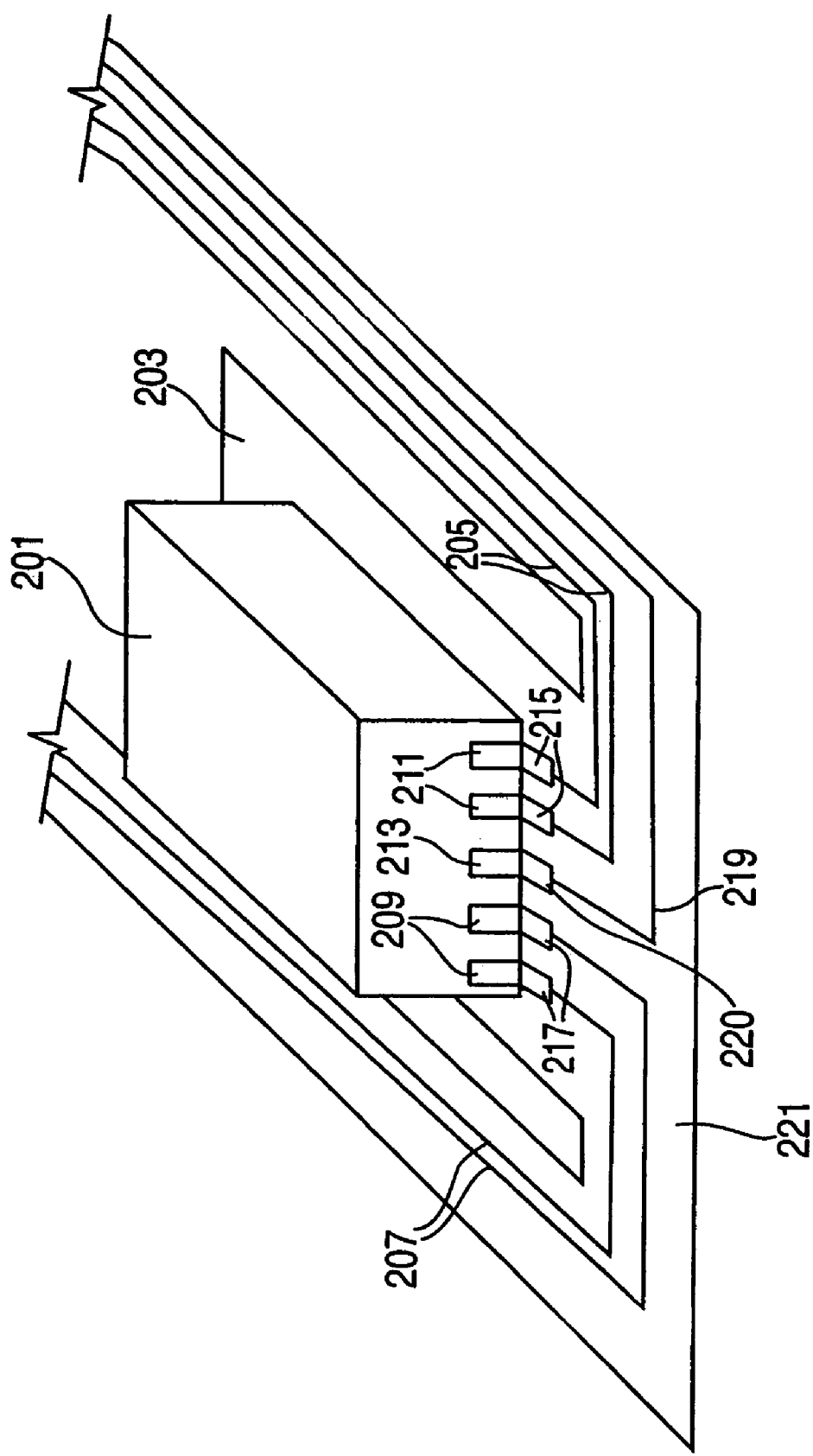
FIG. 3 is perspective view of part of a suspension showing the addition of a bonding pad and trace for grounding a read/write head/slider according to a first embodiment of the present invention.

Referring to FIG. 3, a first embodiment of the present invention is shown. In this embodiment, a slider 201 is provided including read and write electrical components at a trailing end of the slider. Bonding pads 209 and 211 are provided on the slider for electrically connecting the read and write electrical components to electrical components on the suspension 221. In this embodiment, the electrical components of the suspension include four conductive traces 205, 207 that are coupled to bonding pads 215, 217, respectively, for read/write signals. In a typical suspension as known in the art, the conductive traces 205, 207 may be incorporated into the suspension 221, or created separately in a flex circuit or the like that is coupled to the suspension. Also, the traces are electrically coupled to electrical components of the disk drive (e.g., a preamplifier, not shown specifically in FIG. 3) that control the reading of data from and writing of data to the storage medium.

According to this embodiment of the present invention, the slider 201 is coupled to a tongue 203 of the suspension in a conventional manner (e.g., with an electrically insulative adhesive). A separate ground bonding pad 213 is provided on an outer surface of the slider 201. For example, the bonding pad may be coupled to electrical components within the slider 201 that are to be coupled to electrical ground. A separate ground pad 220 is provided on the suspension along with a ground trace 219 to provide a conductive path to an electrical ground component in the disk drive apparatus (e.g., via the preamplifier). After the slider 201 is attached to the tongue 203, the bonding pads 209, 211, 213 of the slider may be electrically coupled to the bonding pads 217, 215, 220 of the suspension by, for example, the gold ball bonding structure shown in FIG. 2. Other methods of electrical connection may be used including ultrasonic bonding and soldering.

Figure 4:
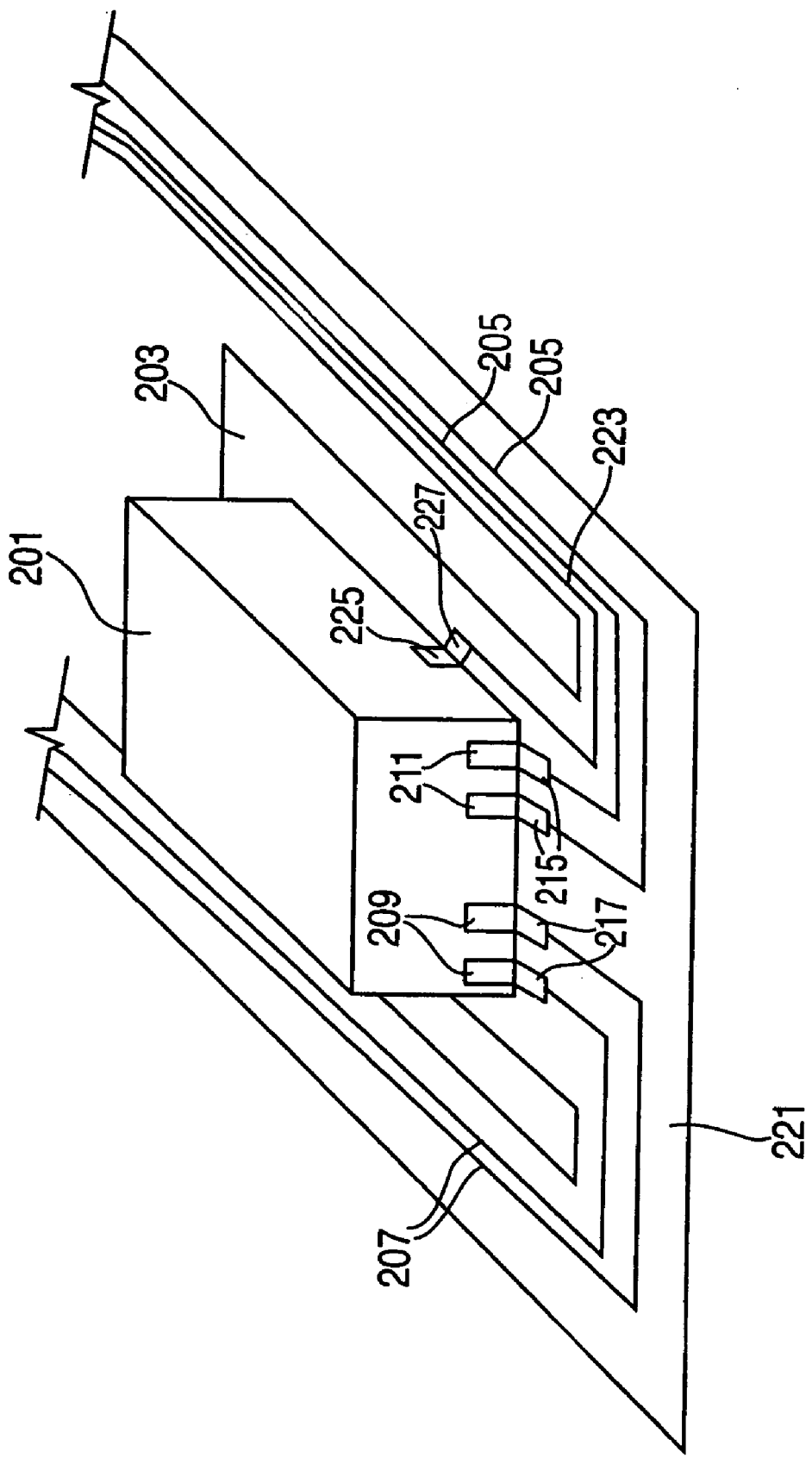
FIG. 4 is a perspective view of a part of a suspension showing the addition of a bonding pad and trace for grounding a read/write head/slider according to a second embodiment of the present invention.
Figure 4A:
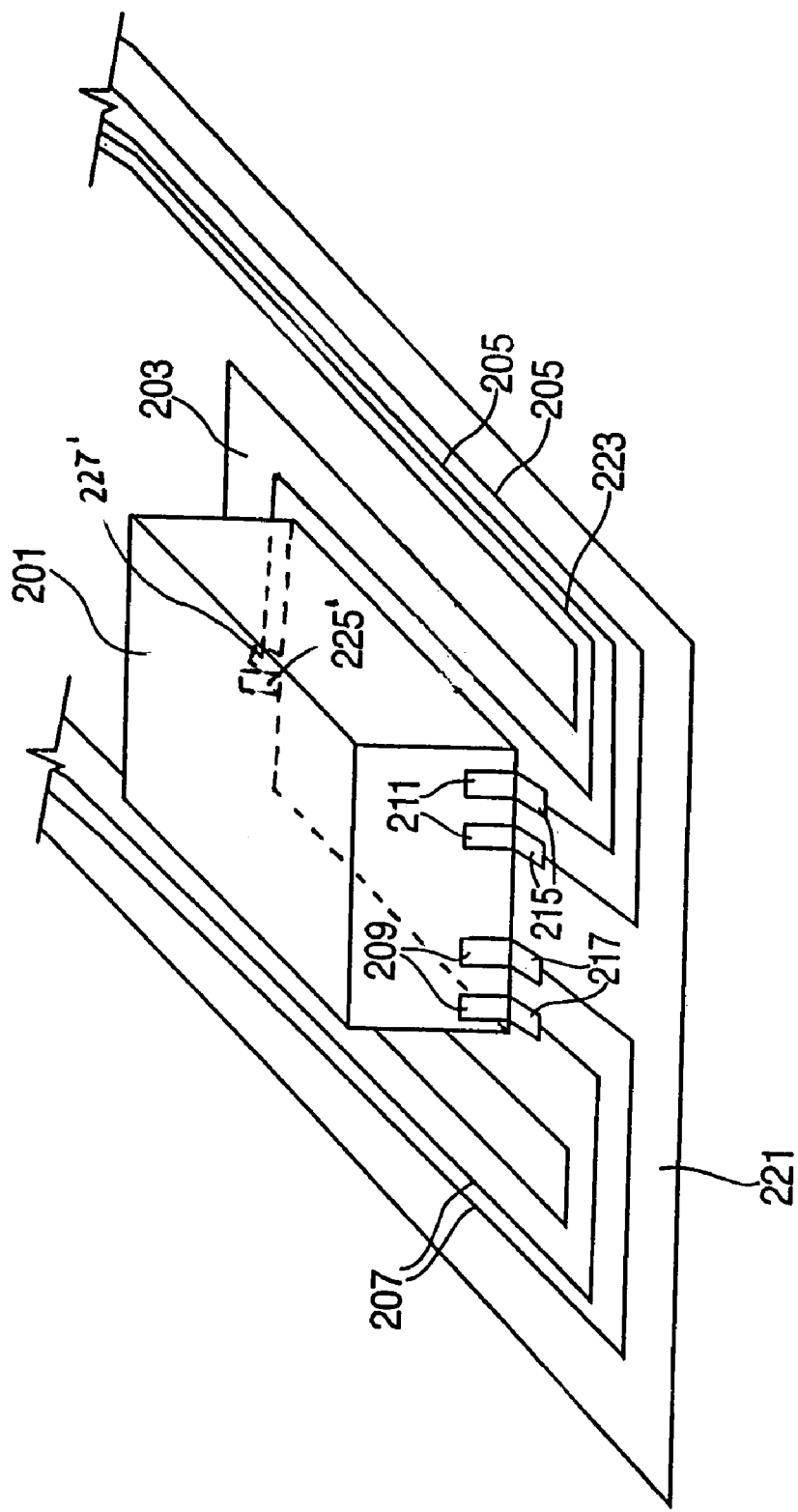
FIG. 4a is a perspective view of a suspension showing the addition of a bonding pad and trace for grounding a read/write head/slider according to a third embodiment of the present invention.

An alternate embodiment of the present invention is shown in FIG. 4. In this embodiment, a separate ground pad 225 is provided on a side surface of the slider instead of the trailing side of the slider 201. As with the embodiment of FIG. 3, the ground pad 225 is electrically coupled within the slider 201 to components that are to be electrically coupled to ground. Likewise, a separate ground pad 227 is provided on the suspension 221 along with a conductive trace 223 to electrically couple bonding pad 225 to the electrical ground in the hard disk drive device. As with the embodiment of FIG. 3, gold ball bonding as shown in FIG. 2 may be used to electrically couple bonding pads 209, 211, 225 of the slider 201 to bonding pads 217, 215, 227 of the suspension. In another, alternate embodiment of the present invention, shown in FIG. 4a, a ground pad 225' may be placed at the leading edge of the slider 201, and a separate ground pad 227'is provided on the suspension 221 with conductive trace 223 to electrically couple bonding pad 225' to the electrical ground in the hard disk device.

Numerous benefits can be gained from the embodiments of the invention shown herein thus far. First of all, the grounding resistance can be made to be low and consistent. Second, the slider flatness control will be improved. In addition, the HGA assembly process can be greatly simplified. For example, the conductive glue application process can be eliminated during manufacture. Glue setting processes can also be simplified, since the use of a conductive epoxy may not be needed.

The invention above is not limited to these examples. For example, the separate ground pad may be placed at locations on the slider other than those shown in FIGS. 3 and 4. For example, the pad may be located at the leading edge of the slider. Also, conductors other than traces incorporated into either side of the suspension may be used, including a separate wire. In one embodiment of FIGS. 3 and 4, the separate pad is coupled to the substrate of the slider so that it can be grounded. The separate pad may be coupled to other components in the slider as needed. Likewise, the separate pad may be coupled to other components in the disk drive apparatus. When the read/write circuitry and the separate pad are at the trailing edge of the slider (as in FIG. 3), the electrical connection from the pad to the slider substrate can be electrically isolated from the read/write circuitry in the slider using any of a variety of known isolation techniques during wafer fabrication processes. Furthermore, the embodiments of FIGS. 3 and 4 are for descriptive purposes and are not necessarily drawn to scale.

Figure 5:
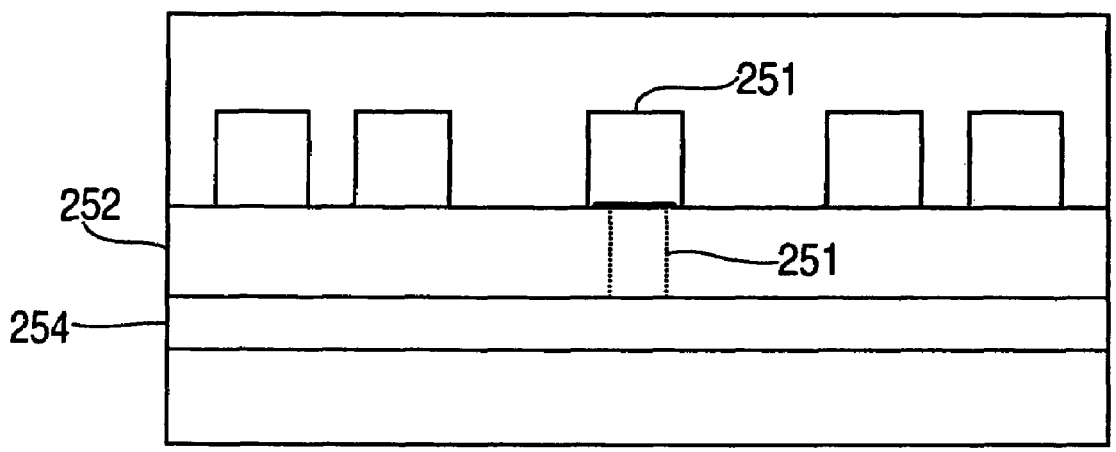
FIG. 5 is a perspective view of a part of a suspension showing the addition of a bonding pad and trace for grounding a read/write head/slider according to a third embodiment of the present invention.

Referring to FIG. 5, an additional embodiment of the present invention is shown. As stated above, an electrical grounding connection may be sought between the slider and ground outside of one through a conductive adhesive that binds the slider to the HGA. In the embodiment of FIG. 5, the ground pad 251 on the suspension 252 is coupled to a grounding plane 254 within the suspension body. In this embodiment, the suspension 252 includes a metal plane 254 that may be connected to ground (e.g., through the preamplifier). The connection between the ground pad 251 to the grounding plane 254 may be achieved through any of a variety of known methods (e.g., a plated through-hole connection 253).

Referring to FIGS. 6-9, further embodiments of the present invention are shown related to the use of segmented traces to couple the slider to ground, for example.

Figure 6:
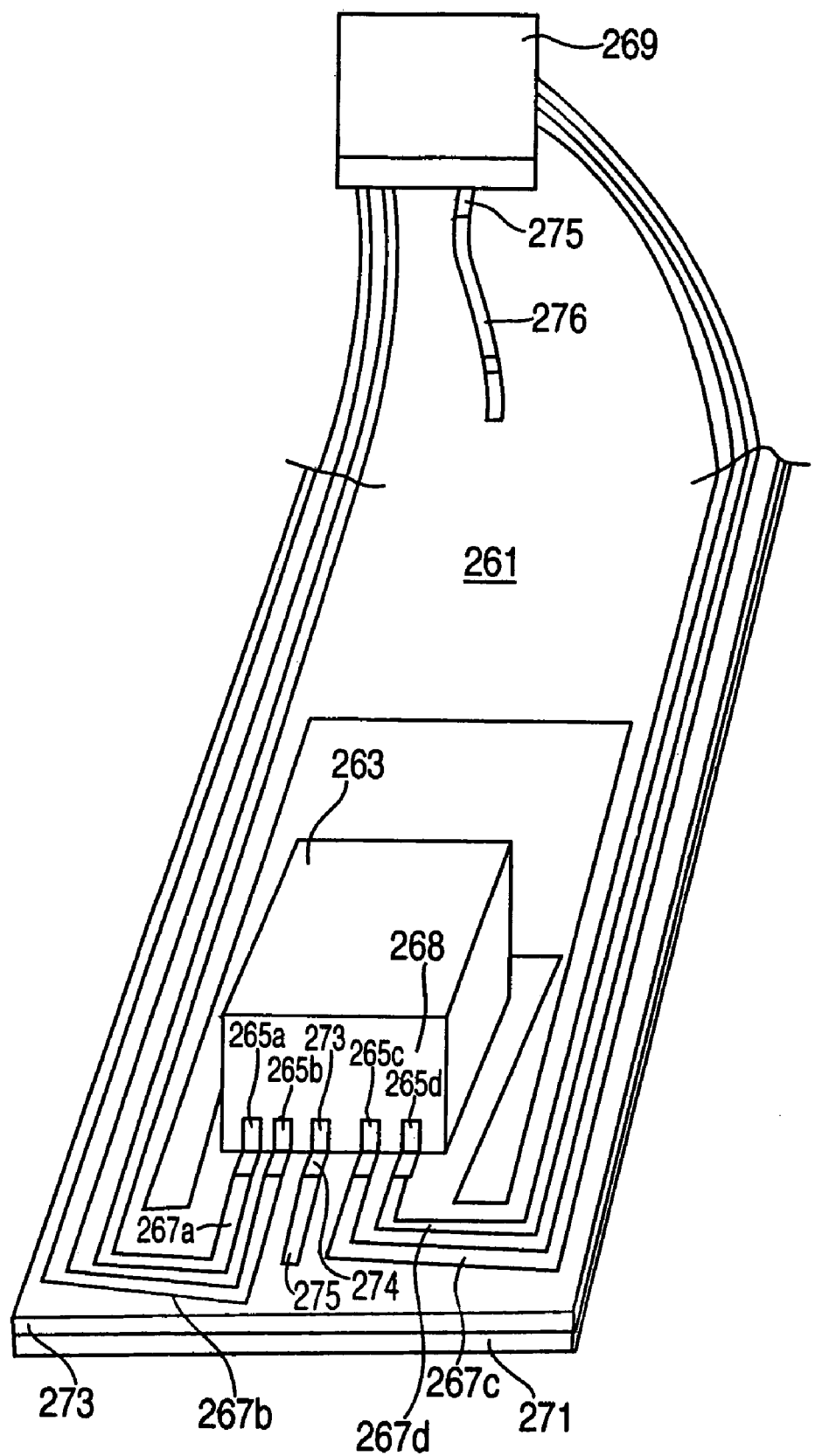
FIG. 6 is a perspective view of a suspension showing the addition of segmented traces to connect a slider component to ground according to an embodiment of the present invention.

Referring to FIG. 6, a suspension 261 is shown with an integrated flexure 262 and an attached slider component 263. In this embodiment, the slider component 263 includes four pads 265a-d as are conventionally provided for read and write signals for the recording head component 268 of the slider 263. These pads 265a-d are electrically coupled to other pads on the flexure 262, which in turn are coupled to read/write traces 267a-d that are coupled to a preamplifier 269. In this embodiment, the suspension includes a stainless steel base 271 and a dielectric layer 273 to assist in electrical separation of the traces 267a-d from the stainless steel base 271.

According to an embodiment of the present invention, a segmented trace is provided to electrically couple the slider to ground. In this embodiment, the slider includes a grounding pad 273 as described above. When the slider 263 is coupled to the flexure 262, the ground pad 273 of the slider can be electrically coupled to a corresponding ground pad 274 on the flexure. A first segment 275 of a trace is electrically coupled to the ground pad 274. In addition, a second segment 276 of a trace is electrically coupled to ground (e.g., ground terminal 275 of pre-amplifier 269). The first and second segments 275, 276 may be electrically coupled together via the stainless steel base 271 of the suspension 261 as described below.

Figure 7:
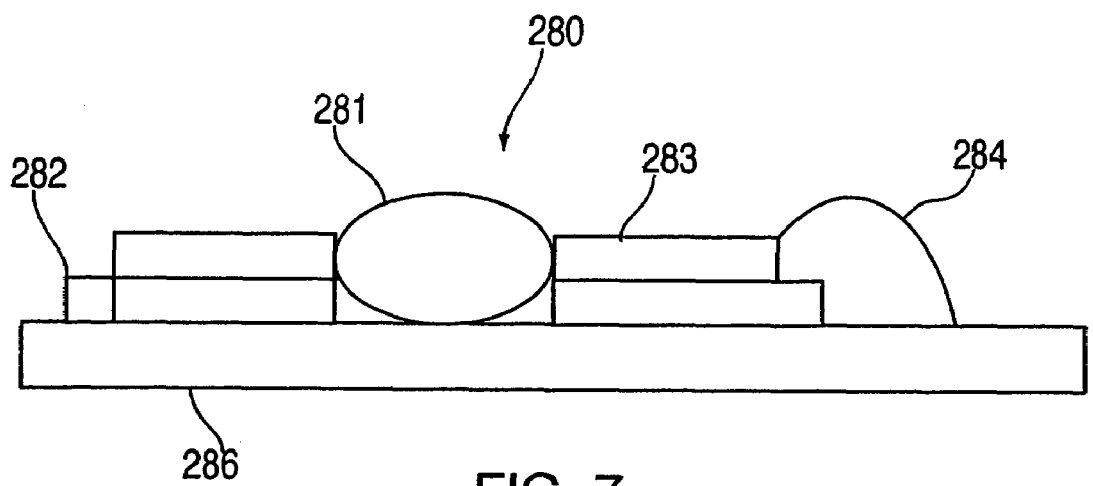
FIG. 7 is a cross-section of a suspension showing the electrical connection between a trace segment and the stainless steel base of the suspension according to a first embodiment of the present invention.

Referring to FIG. 7, a first embodiment of a method for electrically coupling a trace segment to the stainless steel base of a suspension is shown. In the embodiment of FIG. 7, the traces for electrically coupling the preamplifier to the slider are built through a subtractive process such as a trace suspension assembly (TSA). In a TSA, the suspension comprises at least three layers: a top conductor layer 283 (e.g., made of copper), an intermediate dielectric layer 282, and a base layer 286 (e.g., made of stainless steel). Then, material is taken away (e.g., through etching) to form the trace conductors (e.g., in the form shown in FIG. 6). According to an embodiment of the present invention, an opening 280 is made through the copper layer 283 and the intermediate dielectric layer 282 and/or an edge 284 is made to expose the stainless steel base 286. Then a conductive material 281 (i.e., gold, solder, etc.) may be deposited into the opening 280 or at the edge 284 so as to create an electrical connection between the copper trace 283 and the stainless steel base. Referring back to FIG. 6, such an electrical connection would be made at both the first and second trace segments so as to create an electrical connection between the slider (e.g., a grounding pad 273) and the ground terminal 275.

Figure 8:
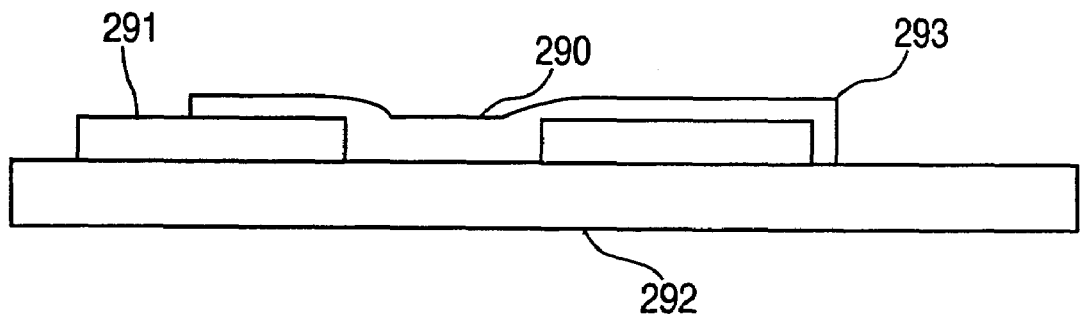
FIG. 8 is a cross-section of a suspension showing the electrical connection between a trace segment and the stainless steel base of the suspension according to a second embodiment of the present invention.

Referring to FIG. 8, a second embodiment for electrically coupling a trace segment to the stainless steel base is shown. In this embodiment, the traces are created through an additive process such as in a circuit integrated suspension (CIS). In such an additive process, the dielectric layer 291 is deposited onto a stainless steel base 292 and then the conductive trace 293 is deposited on top of the dielectric layer 291. In this embodiment, an opening 290 is made in the dielectric layer 291. For example, after the dielectric layer 291 is deposited onto the stainless steel base 292, the opening 290 may be formed into the dielectric layer through an etching process. Alternatively, the dielectric layer 291 may be deposited in such a manner so as to create an opening to the base 292 during the deposition process. After the opening is created, the conductive trace 293 is deposited into the opening so as to create an electrical connection (e.g., between one of the trace segments 275, 276 and the stainless steel base 271 in FIG. 6).

Figure 9:
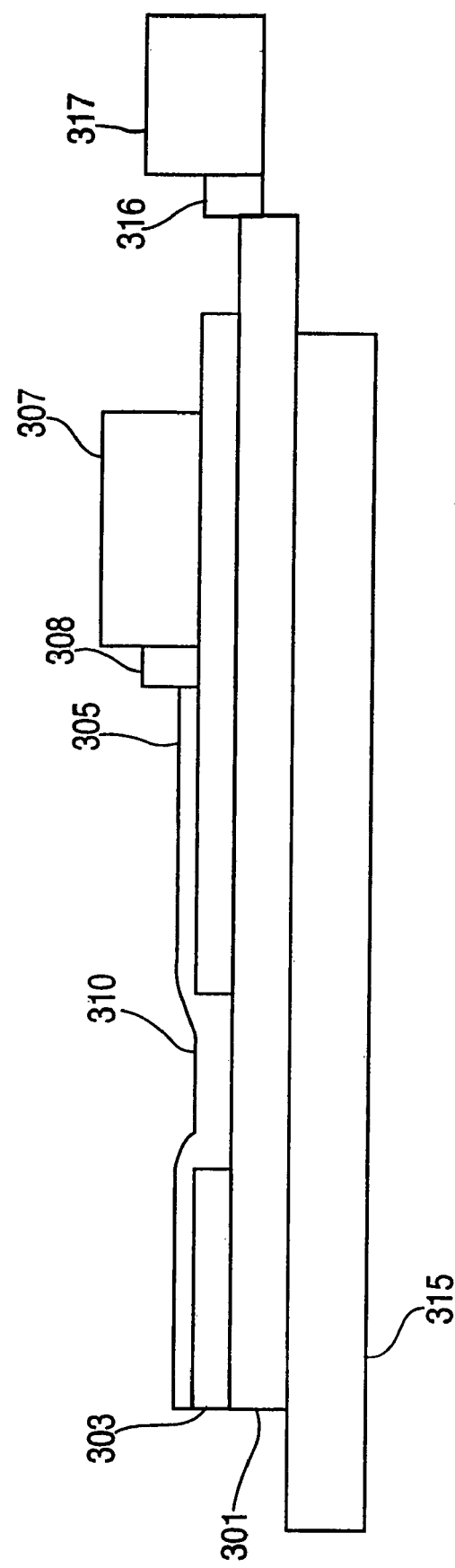
FIG. 9 is a cross-section of a suspension showing the electrical connection between a trace segment and the stainless steel base as well as the connection of the base to the grounding terminal of the pre-amplifier according to a third embodiment of the present invention.

Referring to FIG. 9, a third embodiment for electrically coupling a trace segment to the stainless steel base is shown. In this embodiment, the copper traces are formed as part of a flex suspension assembly (FSA). Referring to FIG. 9, the FSA includes a copper ground plane 301, a dielectric layer 303, and metal traces including trace segment 305. Once formed, the FSA is then attached to the suspension 315, which can be made entirely of stainless steel. The slider 307 can then be attached to the flexure of the suspension and electrically coupled to the copper trace segment via a separate ground pad 308 on the surface of the slider 307. In this embodiment, an opening 310 is made in the dielectric layer 303 so that trace segment 305 can make electrical contact with the copper ground plane 301. As with the embodiment shown in FIG. 7, the electrical connection may be made by providing a separate, conductive material (e.g., a gold ball or solder ball) in the opening coupling the trace segment to the ground plane. Likewise, with the embodiment of FIG. 8, the copper trace segment 305 may be formed across the opening to connect to the copper ground plane. Though a separate trace segment may be provided to couple the ground terminal 316 of the pre-amplifier 317 to the stainless steel base 315, in this embodiment, copper ground plane 301 is coupled directly to the ground terminal 316.

It is noted that though only one or two trace segments are provided in the embodiments above, the present invention is not so limited. Multiple trace segments may be used between the slider and ground. Also, though the use of trace segments has been shown to connect the slider to the ground terminal of the preamplifier, such trace segments may be used to electrically connect other components together. For example, trace segments may be used to connect the slider to other grounding components in the disk drive. Also, trace segments may be used to connect an electrical circuit within the slider to other components in the disk drive.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A slider comprising:
   A slider body including a substrate, circuitry to write and read data on a recording disk, at least one bonding pad to pass read/write signals and a separate ground bonding pad electrically coupled to said substrate wherein said separate ground bonding pad is located at one of a leading edge and a side edge of said slider, other than a trailing edge of the slider.

2. The slider of claim 1 wherein said electrical coupling between said separate ground bonding pad and said substrate is electrically isolated from other circuitry in the slider.

3. The slider of claim 1 wherein said electrical coupling is between the separate ground bonding pad and a substrate within the slider.

4. The slider of claim 1 wherein said separate ground bonding pad is located at the leading edge of said slider.

* * * * *